US010483364B2

(12) United States Patent
Chang et al.

(10) Patent No.: US 10,483,364 B2
(45) Date of Patent: Nov. 19, 2019

(54) SEMICONDUCTOR STRUCTURE AND MANUFACTURING METHOD THEREOF

(71) Applicant: Taiwan Semiconductor Manufacturing Company, Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/050,747

(22) Filed: Jul. 31, 2018

(65) Prior Publication Data

US 2018/0374923 A1 Dec. 27, 2018

Related U.S. Application Data

(62) Division of application No. 14/987,598, filed on Jan. 4, 2016, now Pat. No. 10,164,029.

(60) Provisional application No. 62/269,667, filed on Dec. 18, 2015.

(51) Int. Cl.
| H01L 29/417 | (2006.01) |
| H01L 21/768 | (2006.01) |
| H01L 21/311 | (2006.01) |
| H01L 23/535 | (2006.01) |
| H01L 29/06 | (2006.01) |
| H01L 29/78 | (2006.01) |

(52) U.S. Cl.
CPC .. *H01L 29/41775* (2013.01); *H01L 21/31111* (2013.01); *H01L 21/7682* (2013.01); *H01L 21/76897* (2013.01); *H01L 23/535* (2013.01); *H01L 29/0653* (2013.01); *H01L 29/41783* (2013.01); *H01L 29/41791* (2013.01); *H01L 29/7831* (2013.01); *H01L 2221/1042* (2013.01); *H01L 2221/1047* (2013.01); *H01L 2221/1063* (2013.01)

(58) Field of Classification Search
CPC ......... H01L 21/7682; H01L 2221/1042; H01L 2221/1047; H01L 29/41775; H01L 29/41783; H01L 29/41791
See application file for complete search history.

(56) References Cited

U.S. PATENT DOCUMENTS

| 8,847,401 B2* | 9/2014 | Chen ................... H01L 23/5222 257/249 |
| 2013/0248950 A1 | 9/2013 | Kang et al. |
| 2014/0054713 A1 | 2/2014 | Lee et al. |
| 2015/0243544 A1* | 8/2015 | Alptekin ............. H01L 21/7682 438/586 |
| 2016/0005833 A1 | 1/2016 | Collins et al. |

* cited by examiner

*Primary Examiner* — Jose R Diaz
(74) *Attorney, Agent, or Firm* — Slater Matsil, LLP

(57) ABSTRACT

A semiconductor structure includes a substrate, at least one first gate structure, at least one first spacer, at least one source drain structure, and a conductive plug. The first gate structure is present on the substrate. The first spacer is present on at least one sidewall of the first gate structure. The source drain structure is present adjacent to the first spacer. The conductive plug is electrically connected to the source drain structure while leaving a gap between the conductive plug and the spacer.

20 Claims, 4 Drawing Sheets

US 10,483,364 B2

SEMICONDUCTOR STRUCTURE AND MANUFACTURING METHOD THEREOF

PRIORITY CLAIM AND CROSS-REFERENCE

This application is a divisional of U.S. patent application Ser. No. 14/987,598, entitled "Semiconductor Structure and Manufacturing Method Thereof," filed on Jan. 4, 2016, which claims priority to U.S. provisional application No. 62/269,667, entitled "Semiconductor Structure and Manufacturing Method Thereof,: filed on Dec. 18, 2015, which applications are hereby incorporated herein by reference.

BACKGROUND

Semiconductor devices are used in a variety of electronic applications, such as personal computers, cell phones, digital cameras, and other electronic equipment, as examples. The semiconductor industry continues to improve the integration density of various electronic components (e.g., transistors, diodes, resistors, capacitors, etc.) by continual reductions in minimum feature size, which allow more components to be integrated into a given area.

The word "interconnection" in integrated circuits means conductive lines which connect the various electronic components. The interconnecting conductive lines are separated from the substrate by insulating layers, except on the contact area. As feature densities increase, the widths of the conductive lines and the spacing between the conductive lines of interconnect structures also scale smaller.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
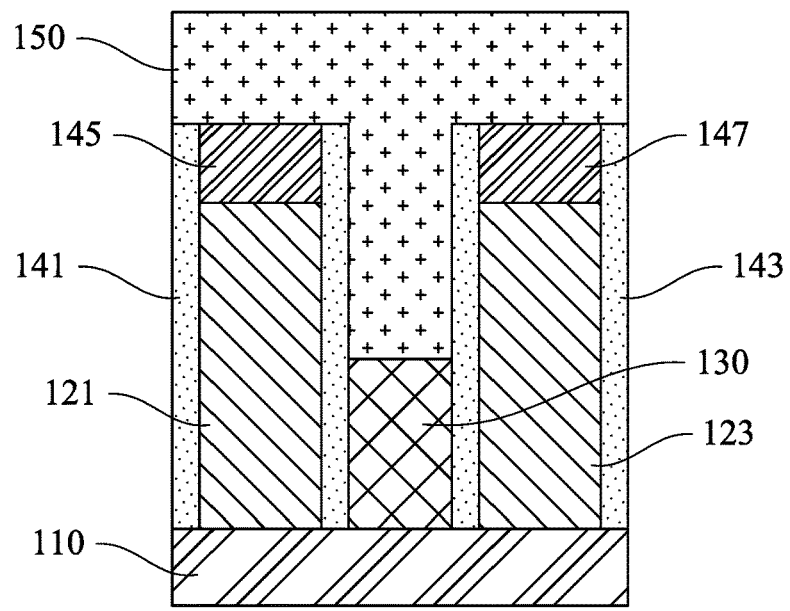
FIGS. 1-8 are cross-sectional views of a method for manufacturing a semiconductor structure at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Unless otherwise defined, all terms (including technical and scientific terms) used herein have the same meaning as commonly understood by the person having ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIGS. 1-8 are cross-sectional views of a method for manufacturing a semiconductor structure 100 at various stages in accordance with some embodiments of the present disclosure.

Reference is made to FIG. 1. A semiconductor structure is formed. The semiconductor structure includes a substrate 110, gate structures 121 and 123, and at least one source drain structure 130. The gate structures 121 and 123 are respectively present on the substrate 110. The source drain structure 130 is present on the substrate 110 and adjacent to the gate structures 121 and 123. In other words, the source drain structure 130 is present between the gate structures 121 and 123. It is note that the numbers of the gate structures 121 and 123 and the number of the source drain structure 130 are illustrative and should not limit various embodiments of the present disclosure. A person having ordinary skill in the art may select suitable numbers for the gate structures 121 and 123 and the source drain structure 130 according to actual situations.

In some embodiments, the substrate 110 may be made of a semiconductor material and may include, for example, a graded layer or a buried oxide therein. In some embodiments, the substrate 110 includes bulk silicon that may be undoped or doped (e.g., p-type, n-type, or combinations thereof). Other materials that are suitable for semiconductor device formation may be used. For example, germanium, quartz, sapphire, and glass could alternatively be used for the substrate 110. Alternatively, the substrate 110 may be an active layer of a semiconductor-on-insulator (SOI) substrate or a multi-layered structure, such as a silicon-germanium layer formed on a bulk silicon layer.

In some embodiments, at least one stack of a gate dielectric layer, a diffusion barrier layer, a metal layer, a block layer, a wetting layer, and filling metal form at least one of the gate structures 121 and 123. In other words, at least one of the gate structures 121 and 123 may include the stack of the gate dielectric layer, the diffusion barrier layer, the metal layer, the block layer, the wetting layer, and the filling metal.

In some embodiments, the gate dielectric layer includes an interfacial layer (IL, the lower part of the gate dielectric layer), which is a dielectric layer. In some embodiments, the IL includes an oxide layer, such as a silicon oxide layer, which may be formed through a thermal oxidation of the substrate 110, a chemical oxidation, or a deposition step. The gate dielectric layer may also include a high-k dielectric layer (the upper part of the gate dielectric layer) including a high-k dielectric material, such as hafnium oxide, lanthanum oxide, aluminum oxide, or combinations thereof. The dielectric constant (k-value) of the high-k dielectric material is higher than about 3.9, and may be higher than about 7, and sometimes as high as about 21 or higher. The high-k dielectric layer is overlying, and may contact, the IL.

In some embodiments, the diffusion barrier layer includes TiN, TaN, or combinations thereof. For example, the diffusion barrier layer may include a TiN layer (the lower part of the diffusion barrier layer), and a TaN layer (the upper part of the diffusion barrier layer) over the TiN layer.

When one of the gate structures 121 and 123 forms an n-type metal-oxide-semiconductor (MOS) device, the metal layer is in contact with the diffusion barrier layer. For example, in the embodiments in which the diffusion barrier layer includes a TiN layer and a TaN layer, the metal layer may be in physical contact with the TaN layer. In alternative embodiments in which one of the gate structures 121 and 123 forms a p-type MOS device, an additional TiN layer is formed between, and in contact with, the TaN layer (in the diffusion barrier layer) and the overlaying metal layer. The additional TiN layer provides the work function suitable for the pMOS device, which work function is higher than the mid-gap work function (about 4.5 eV) that is in the middle of the valance band and the conduction band of silicon. The work function higher than the mid-gap work function is referred to as a p-work function, and the respective metal having the p-work function is referred to as a p-metal.

The metal layer provides the work function suitable for the nMOS device, which work function is lower than the mid-gap work function. The work function lower than the mid-gap work function is referred to as an n-work function, and the respective metal having the n-work function may be referred to as an n-metal. In some embodiments, the metal layer is an n-metal having a work function lower than about 4.3 eV. The work function of the metal layer may also be in a range from about 3.8 eV to about 4.6 eV. The metal layer may include titanium aluminum (TiAl) (which may include, or free from or substantially free from other elements) in accordance with some embodiments. The formation of the metal layer may be achieved through physical vapor deposition (PVD). In accordance with some embodiments of the present disclosure, the metal layer is formed at room temperature (for example, from about 20° C. to about 25° C.). In alternative embodiments, the metal layer is formed at an elevated temperature higher than the room temperature, for example, higher than about 200° C.

The block layer may include TiN in some embodiments. The block layer may be formed using atomic layer deposition (ALD).

The wetting layer has an ability to adhere (and wet) the subsequently formed filling metal during the reflow of the filling metal. In some embodiments, the wetting layer is a cobalt layer, which may be formed using atomic layer deposition (ALD) or chemical vapor deposition (CVD).

The filling metal may include aluminum, an aluminum alloy (e.g., titanium aluminum), tungsten, or copper, which may also be formed using physical vapor deposition (PVD), chemical vapor deposition (CVD), or the like. The filling metal may be reflowed. The formation of the wetting layer improves the wetting of the filling metal to the underlying layers.

The source drain structure 130 may be formed by doping impurities into at least one active semiconductor fin, which is formed by, for example, patterning and etching the substrate 110 using photolithography techniques. In some embodiments that the resulting MOS device is an nMOS device, n-type impurities such as phosphorous or arsenic may be doped in the source drain structure 130. In some other embodiments that the resulting MOS device is a pMOS device, p-type impurities such as boron or $BF_2$ may be doped in the source drain structure 130.

Alternatively, the source drain structure 130 may be formed by, for example, epitaxially grown. In these embodiments, the source drain structure 130 may function as a source drain stressor to enhance carrier mobility of the semiconductor device and the device performance. The source drain structure 130 may be formed using a cyclic deposition and etching (CDE) process. The CDE process includes an epitaxial deposition/partial etch process and repeating the epitaxial deposition/partial etch process at least once.

In some embodiments that the resulting MOS device is an nMOS device, the source drain structure 130 may be an n-type epitaxy structure. In some embodiments that the resulting MOS device is a pMOS device, the source drain structure 130 may be a p-type epitaxy structure. The n-type epitaxy structure may be made of SiP, SiC, SiPC, Si, III-V compound semiconductor materials or combinations thereof, and the p-type epitaxy structure may be made of SiGe, SiGeC, Ge, Si, III-V compound semiconductor materials, or combinations thereof. During the formation of the n-type epitaxy structure, n-type impurities such as phosphorous or arsenic may be doped with the proceeding of the epitaxy. For example, when the n-type epitaxy structure include SiP or SiC, n-type impurities are doped. Moreover, during the formation of the p-type epitaxy structure, p-type impurities such as boron or $BF_2$ may be doped with the proceeding of the epitaxy. For example, when the p-type epitaxy structure includes SiGe, p-type impurities are doped. The epitaxy processes include CVD deposition techniques (e.g., vapor-phase epitaxy (VPE) and/or ultra-high vacuum CVD (UHV-CVD)), molecular beam epitaxy, and/or other suitable processes. The source drain structure 130 may be in-situ doped. If the source drain structure 130 are not in-situ doped, a second implantation process (i.e., a junction implant process) is performed to dope the source drain structure 130. One or more annealing processes may be performed to activate the source drain structure 130. The annealing processes include rapid thermal annealing (RTA) and/or laser annealing processes.

In addition, spacers 141 are present on sidewalls of the gate structure 121, and spacers 143 are present on sidewalls of the gate structure 123. In some embodiments, at least one of the spacers 140 and 143 include one or more layers, including silicon nitride, silicon oxynitride, silicon oxide, or other dielectric materials. The available formation methods include plasma enhanced chemical vapor deposition (PECVD), low-pressure chemical vapor deposition (LP- CVD), sub-atmospheric chemical vapor deposition (SACVD), and other deposition methods.

Moreover, a hard mask layer 145 is present on a top surface of the gate structure 121, and a hard mask layer 147 is present on a top surface of the gate structure 123. The hard mask layer 145 and 147 may include, for example, silicon nitride or the like. The hard mask layer 145 and 147 may be formed using chemical vapor deposition (CVD), physical vapor deposition (PVD), atomic layer deposition (ALD), other suitable processes, or combinations thereof.

Then, a dielectric layer 150 is formed on the gate structures 121 and 123 and the source drain structure 130. The dielectric layer 150 is an interlayer dielectric (ILD) layer. The dielectric layer 150 is made of a dielectric material, such as silicon oxide, silicon nitride, silicon oxynitride, or combinations thereof. In some embodiments, the dielectric layer 150 is made of a low-κ dielectric material to improve resistive-capacitive (RC) delay. The dielectric constant of the low-κ dielectric material is lower than that of silicon dioxide ($SiO_2$). One approach to reduce the dielectric constant of a dielectric material is to introduce carbon (C) or fluorine (F) atoms. For example, in $SiO_2$ (κ=3.9), the introduction of C atoms to form hydrogenated carbon-doped silicon oxide (SiCOH) (κ is between 2.7 and 3.3) and the introduction of F atoms to form fluorosilicate glass (FSG) (κ is between 3.5 and 3.9) reduces its dielectric constant. In some embodiments, the low-κ dielectric material is, for example, nanopore carbon doped oxide (CDO), black diamond (BD), a benzocyclobutene (BCB) based polymer, an aromatic (hydrocarbon) thermosetting polymer (ATP), hydrogen silsesquioxane (HSQ), methyl silsesquioxane (MSQ), poly-arylene ethers (PAE), diamond-like carbon (DLC) doped with nitrogen, or combinations thereof. The dielectric layer 150 is formed by, for example, chemical vapor deposition (CVD), spin coating, or combinations thereof.

Figure 2:
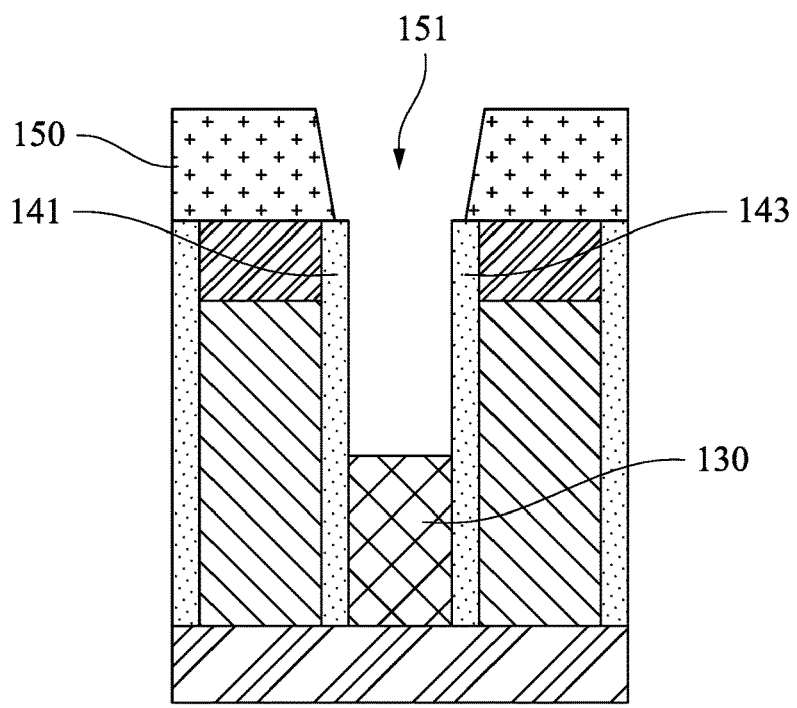

Reference is made to FIG. 2. An opening 151 is formed in the dielectric layer 150 to expose the source drain structure 130 and at least a portion of at least one of spacers 141 and 143. The opening 151 is formed by a photolithography and etching process. The photolithography and etching process includes photoresist application, exposure, developing, etching, and photoresist removal. A photoresist is applied onto the dielectric layer 150 by, for example, spin coating. The photoresist is then prebaked to drive off excess photoresist solvent. After prebaking, the photoresist is exposed to a pattern of intense light.

The intense light is, for example, a G-line with a wavelength of about 436 nm, an I-line with a wavelength of about 365 nm, a krypton fluoride (KrF) excimer laser with a wavelength of about 248 nm, an argon fluoride (ArF) excimer laser with a wavelength of about 193 nm, a fluoride ($F_2$) excimer laser with a wavelength of about 157 nm, or combinations thereof. A space between the final lens of the exposure tool and the photoresist surface may be filled with a liquid medium that has a refractive index greater than one during the exposure to enhance the photolithography resolution. The exposure to light causes a chemical change that allows some of the photoresist soluble in a photographic developer.

Then, a post-exposure bake (PEB) may be performed before developing to help reduce standing wave phenomena caused by the destructive and constructive interference patterns of the incident light. The photographic developer is then applied onto the photoresist to remove the some of the photoresist soluble in the photographic developer. The remaining photoresist is then hard-baked to solidify the remaining photoresist.

Portions of the dielectric layer 150 which are not protected by the remaining photoresist are etched to form the opening 151. The etching of the dielectric layer 150 may be dry etching, such as reactive ion etching (RIE), plasma enhanced (PE) etching, or inductively coupled plasma (ICP) etching. In some embodiments, when the dielectric layer 150 is made of silicon oxide, fluorine-based RIE can be used to form the opening 151. The gas etchant used to dry etch the dielectric layer 150 is, for example, $CF_4/O_2$.

After the opening 151 is formed, the photoresist is removed from the dielectric layer 150 by, for example, plasma ashing, stripping, or combinations thereof. Plasma ashing uses a plasma source to generate a monatomic reactive species, such as oxygen or fluorine. The reactive species combines with the photoresist to form ash which is removed with a vacuum pump. Stripping uses a photoresist stripper, such as acetone or a phenol solvent, to remove the photoresist from the dielectric layer 150.

Figure 3:
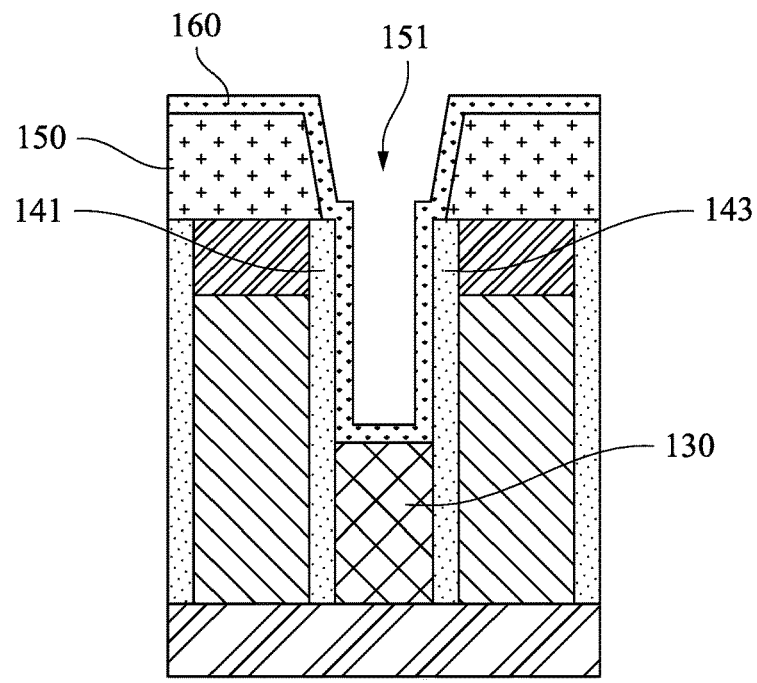

Reference is made to FIG. 3. A protection layer 160 is formed on a top surface of the dielectric layer 150, at least one sidewall of the opening 151 (i.e., at least one sidewall of the dielectric layer 150 and at least a portion of the exposed spacers 141 and 143), and the exposed source drain structure 130. The protection layer 160 may include, for example, silicon nitride, silicon oxynitride, or the like. The protection layer 160 may be formed using atomic layer deposition (ALD), other suitable processes, or combinations thereof.

Figure 4:
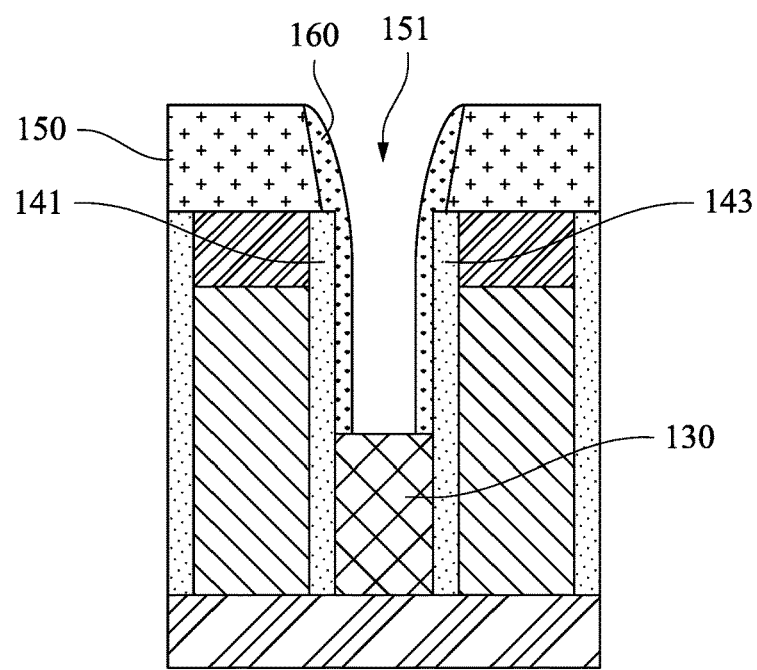

As shown in FIG. 4, an anisotropic etching is performed to remove the protection layer 160 on the top surface of the dielectric layer 150 and the exposed source drain structure 130 while the protection layer 160 still covers the sidewall of the opening 151 (i.e., the sidewall of the dielectric layer 150 and the spacers 141 and 143). Therefore, the source drain structure 130 is exposed by the protection layer 160. In some embodiments, the anisotropic etching may be dry etching, such as reactive ion etching (RIE), plasma enhanced (PE) etching, or inductively coupled plasma (ICP) etching.

Figure 5:
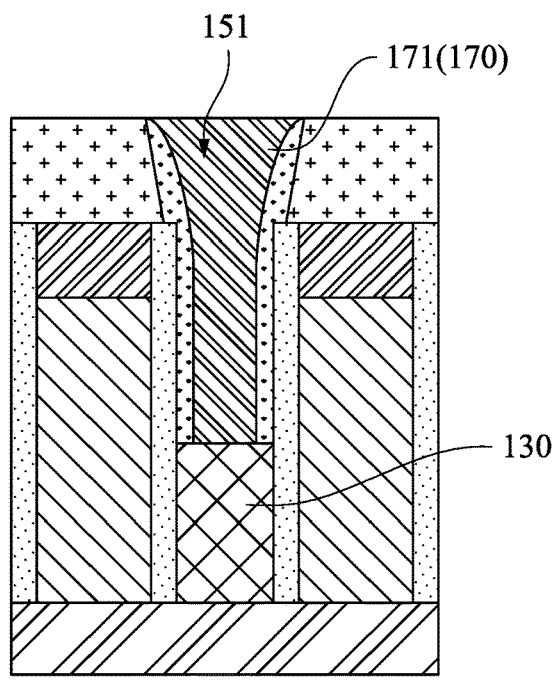

In FIG. 5, a conductive layer 170 overfills the opening 151, and then the excess conductive layer 170 outside of the opening 151 is removed. The conductive layer 170 is made of metal, such as copper (Cu), aluminum (Al), tungsten (W), nickel (Ni), cobalt (Co), titanium (Ti), platinum (Pt), tantalum (Ta), or combinations thereof. The conductive layer 170 is formed by, for example, electrochemical deposition, physical vapor deposition (PVD), chemical vapor deposition (CVD), or combinations thereof.

The excess conductive layer 170 outside of the opening 151 is removed through a removal process. In some embodiments, the conductive layer 170 over burden is removed by a chemical mechanical polishing (CMP) process. In some embodiments, when the conductive layer 170 is made of copper (Cu), the CMP slurry is made of, for example, a mixture of suspended abrasive particles, an oxidizer, and a corrosion inhibitor, and the CMP slurry is acidic. After the CMP process, a conductive plug 171 (the conductive layer 170) is formed in the opening 151. The conductive plug 171 is electrically connected to the source drain structure 130.

Figure 6:
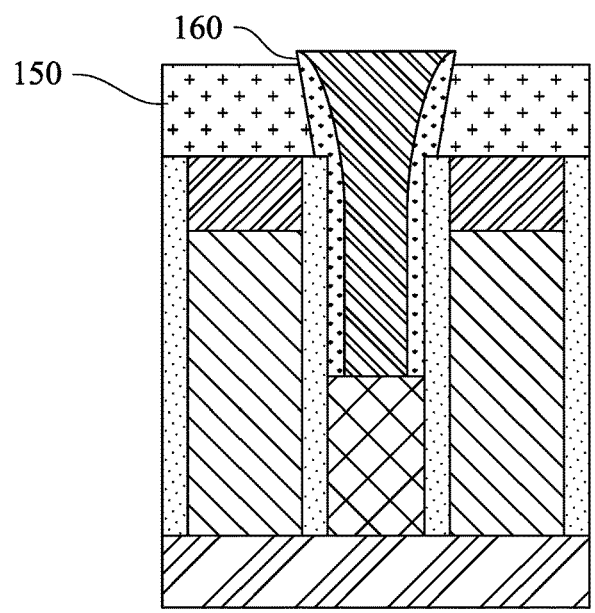

Reference is made to FIG. 6. The dielectric layer 150 is etched back to expose at least a portion of the protection layer 160. The etching of the dielectric layer 150 may be dry etching, such as reactive ion etching (RIE), plasma enhanced (PE) etching, or inductively coupled plasma (ICP) etching. In some embodiments, when the dielectric layer 150 is made of silicon oxide, fluorine-based RIE can be used to etch back the dielectric layer 150. The gas etchant used to dry etch the dielectric layer 150 is, for example, $CF_4/O_2$.

Figure 7:
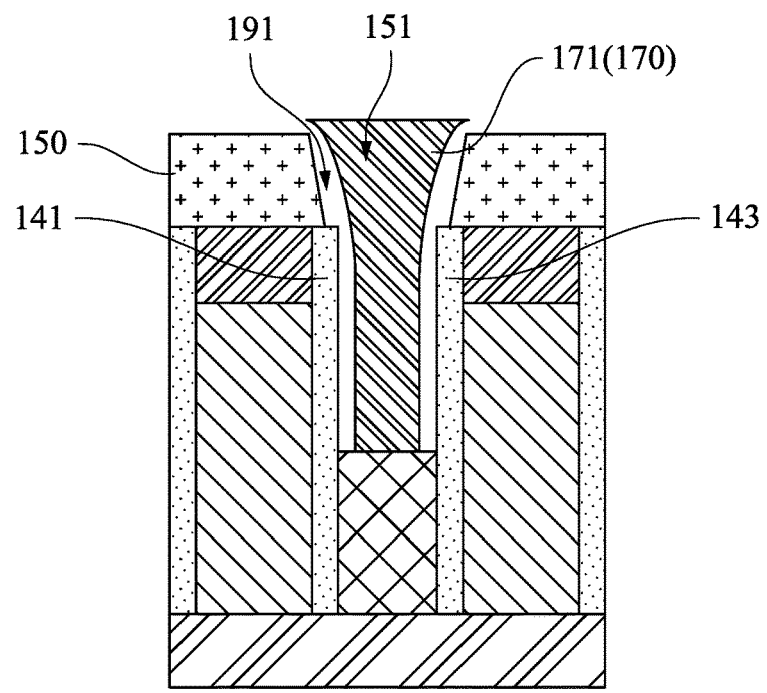
Figure 8:
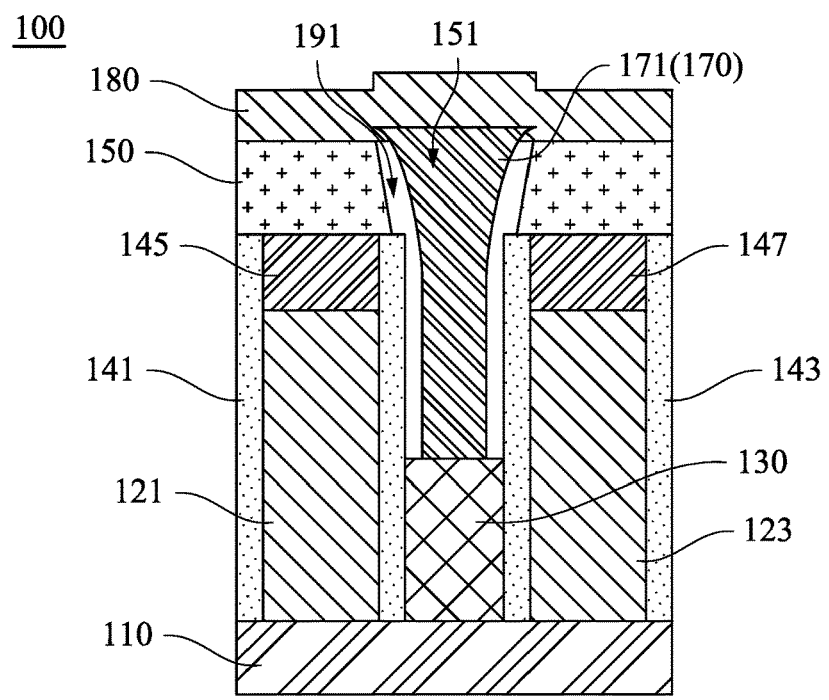

Then, as shown in FIG. 6 and FIG. 7, the protection layer 160 is removed, such that a gap 191 is present between the conductive plug 171 and at least one sidewall of the opening 151 (i.e., the sidewall of the dielectric layer 150 and the spacers 141 and 143). In some embodiments, a selective wet etching process, which is a chemical etching process, may be performed to remove the protection layer 160. A wet etching solution includes a hot phosphoric acid solution. The wet etching processes have etching parameters that can be tuned, such as etchants used, etching temperature, etching solution concentration, etching pressure, etchant flow rate, and other suitable parameters.

Reference is made to FIG. 7. At least one stop layer 180 is formed on the dielectric layer 150 and the conductive plug 171, such that the dielectric layer 150 and the conductive plug 171 is covered by the stop layer 180. The stop layer 180 may include, for example, silicon oxynitride, silicon carbide, silicon carbon oxynitride, silicon nitride, or carbon-doped silicon nitride, or the like. The stop layer 180 may be formed using chemical vapor deposition (CVD), physical vapor deposition (PVD), atomic layer deposition (ALD), other suitable processes, or combinations thereof.

In another aspect of the present disclosure, a semiconductor structure 100 is provided. The semiconductor structure 100 includes a substrate 110, gate structures 121 and 123, spacers 141 and 143, a source drain structure 130, and a conductive plug 171. The gate structures 121 and 123 are present on the substrate 110. The spacer 141 is present on at least one sidewall of the gate structure 121, and the spacer 143 is present on at least one sidewall of the gate structure 123. The source drain structure 130 is present adjacent to the spacers 141 and 143, and the source drain structure 130 is present between the spacers 141 and 143. The conductive plug 171 is electrically connected to the source drain structure 130 while leaving a gap 191 between the conductive plug 171 and the spacer 141 and between the conductive plug 171 and the spacer 143.

The semiconductor structure 100 further includes a dielectric layer 150. The dielectric layer 150 is present at least on one of the gate structures 121 and 123 and has an opening 151 therein. The source drain structure 130 is exposed through the opening 151, and at least a portion of the conductive plug 171 is present in the opening 151. The conductive plug 171 is electrically connected to the source drain structure 130 at least through the opening 151 while leaving the gap 191 between the conductive plug 171 and at least one sidewall of the opening 151.

The semiconductor structure 100 further includes a hard mask layer 145 present on a top surface of the gate structure 121 and a hard mask layer 147 present on a top surface of the gate structure 123. In other words, the hard mask layer 145 is present between the gate structure 121 and the dielectric layer 150, and the hard mask layer 147 is present between the gate structure 123 and the dielectric layer 150.

Further, at least portions of the spacers 141 and 143 are exposed through the opening 151, and the gap 191 further exists between the conductive plug 171 and the portion of the spacer 141 and between the conductive plug 171 and the portion of the spacer 143.

The gap 191 may have gas therein. In other words, the gap 191 may be gas-filled. Embodiments of this disclosure are not limited thereto. The person having ordinary skill in the art can make proper modifications to the gap 191 depending on the actual application.

Specifically, the conductive plug 171 protrudes from the opening 151. Embodiments of this disclosure are not limited thereto. The person having ordinary skill in the art can make proper modifications to the conductive plug 171 depending on the actual application.

In some embodiments of the present disclosure, the gap 191 is formed between the conductive plug 171 and the spacer 141 and between the conductive plug 171 and the spacer 143. In other words, the gap 191 is formed between the conductive plug 171 and at least one sidewall of the opening 151. Since the dielectric constant of air is 1, which is much lower than the dielectric material, the electric isolation between the conductive plug 171 and the gate structures 121 and 123 would become better. Therefore, the device performance would become better, and the parasitic capacitance would become smaller. Further, because the device performance would become better, the loading of the photolithography and etching process and the overlay control can be reduced without interfere the yield of the device. In addition, since the parasitic capacitance would become smaller, the size of the semiconductor structure 100 can be further reduced.

According to some embodiments of the present disclosure, a semiconductor structure includes a substrate, at least one first gate structure, at least one first spacer, at least one source drain structure, and a conductive plug. The first gate structure is present on the substrate. The first spacer is present on at least one sidewall of the first gate structure. The source drain structure is present adjacent to the first spacer. The conductive plug is electrically connected to the source drain structure while leaving a gap between the conductive plug and the spacer.

According to some embodiments of the present disclosure, a semiconductor structure includes a substrate, at least one gate structure, at least one source drain structure, at least one dielectric layer, and a conductive plug. The gate structure is present on the substrate. The source drain structure is present on the substrate. The dielectric layer is present at least on the gate structure and has an opening therein, in which the source drain structure is exposed through the opening. The conductive plug is electrically connected to the source drain structure at least through the opening while leaving a gap between the conductive plug and at least one sidewall of the opening.

According to some embodiments of the present disclosure, a method for manufacturing a semiconductor structure includes the following operations. A dielectric layer is formed on at least one gate structure and at least one source drain structure. An opening is formed in the dielectric layer to expose the source drain structure. A protection layer is formed on at least one sidewall of the opening. A conductive plug is formed in the opening, in which the conductive plug is electrically connected to the source drain structure. The protection layer is removed after the conductive plug is formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, the method comprising:
   forming a dielectric layer on at least one gate structure and at least one source drain structure;
   forming an opening in the dielectric layer to expose the source drain structure;
   forming a protection layer on at least one sidewall of the opening;
   forming a conductive plug in the opening, wherein the conductive plug is electrically connected to the source drain structure;
   etching back the dielectric layer to expose a sidewall of the protection layer after the forming the conductive plug; and
   removing the protection layer after the forming the conductive plug.

2. The method of claim 1, wherein the opening further exposes at least a portion of at least one spacer on at least one sidewall of the gate structure.

3. The method of claim 2, wherein the forming the protection layer further forms the protection layer on the portion of the spacer.

4. The method of claim 2, wherein the forming the protection layer further forms the protection layer on the exposed source drain structure; and
   further comprising:
   removing at least a portion of protection layer on the source drain structure to expose the source drain structure before the forming the conductive plug.

5. The method of claim 1, further comprising:
   forming at least one stop layer on the dielectric layer and the conductive plug.

6. The method of claim 1, wherein the protection layer is removed by chemical etching.

7. The method of claim 1, wherein removing the protection layer forms a gap between the conductive plug and a spacer on the gate structure.

8. The method of claim 7, wherein the gap has a gas therein.

9. The method of claim 7, wherein the gap is between the conductive plug and the dielectric layer.

10. The method of claim 1, wherein the conductive plug has a top surface higher than a top surface of the dielectric layer.

11. A method comprising:
    forming a gate structure over a substrate, the gate structure comprising spacers on sidewalls of a gate electrode and a mask layer over the gate electrode;
    forming a source drain structure on the substrate adjacent the gate structure;
    forming a first dielectric layer on the gate structure and the source drain structure;
    forming an opening in the first dielectric layer to expose the source drain structure;
    lining the opening with a second dielectric layer;
    patterning the second dielectric layer to expose the source drain structure;
    forming a conductive plug on the second dielectric layer in the opening, the conductive plug contacting the source drain structure; and
    removing the second dielectric layer between the conductive plug and the gate structure, wherein after removing the second dielectric layer, the conductive plug has a top surface higher than a top surface of the first dielectric layer.

12. The method of claim 11, wherein the mask layer is coterminous with the gate electrode.

13. The method of claim 11, wherein removing the second dielectric layer forms a gap between the conductive plug and the gate structure.

14. The method of claim 13, wherein the gap extends from a top surface of the first dielectric layer to the source drain structure.

15. The method of claim 13 further comprising:
    forming a third dielectric layer over the conductive plug, the gap, and the first dielectric layer.

16. The method of claim 11 further comprising:
    after the forming the conductive plug, etching back the first dielectric layer to expose at least a portion of the second dielectric layer after the forming the conductive plug.

17. A method comprising:
    forming a first gate structure and a second gate structure over a substrate, the first gate structure being spaced apart from the second gate structure by a first distance;
    forming a source drain structure on the substrate and between the first and second gate structures;
    forming a first dielectric layer over the first and second gate structures and the source drain structure;
    forming a conductive plug contacting the source drain structure, the conductive plug being in the first dielectric layer; and
    after forming the conductive plug, forming a gap between the conductive plug and the first and second gate structures, the gap being filled with a gas, wherein after forming the gap, the conductive plug has an upper portion having a first width, the first width being greater than the first distance.

18. The method of claim 17 further comprising:
    forming an opening through the first dielectric layer to expose the source drain structure;
    forming a second dielectric layer on sidewalls of the opening, the conductive plug being in the opening; and
    etching the second dielectric layer, the etching forming the gap.

19. The method of claim 18, wherein the gap is between the conductive plug and the first dielectric layer.

20. The method of claim 17, wherein the upper portion of the conductive plug is wider than a lower portion of the conductive plug.

* * * * *